(12) United States Patent
DeVries et al.

(10) Patent No.: US 8,030,932 B2
(45) Date of Patent: *Oct. 4, 2011

(54) BANDWIDTH EXPANSION IN MAGNETIC RESONANCE

(75) Inventors: Jon T. DeVries, Jersey City, NJ (US); Erzhen Gao, Millburn, NJ (US); Ingmar Viohl, Milwaukee, WI (US); Greig Scott, Palo Alto, CA (US); Kamal Vij, Chandler, AZ (US); Joseph R. Flicek, New York, NY (US)

(73) Assignee: m2m Imaging Corporation, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/861,344

(22) Filed: Aug. 23, 2010

(65) Prior Publication Data

US 2010/0321020 A1 Dec. 23, 2010

Related U.S. Application Data

(63) Continuation of application No. 11/720,051, filed on Feb. 25, 2008, now Pat. No. 7,782,059.

(60) Provisional application No. 60/630,457, filed on Nov. 23, 2004, provisional application No. 60/630,223, filed on Nov. 23, 2004, provisional application No. 60/630,220, filed on Nov. 23, 2004.

(30) Foreign Application Priority Data

Nov. 22, 2005 (WO) ................ PCT/US2005/004250

(51) Int. Cl.
*G01V 3/00* (2006.01)
(52) U.S. Cl. ........................................ 324/322; 324/318
(58) Field of Classification Search .................. 324/322, 324/318
See application file for complete search history.

(56) References Cited

U.S. PATENT DOCUMENTS

| 5,051,700 A | 9/1991 | Fox |
| 5,488,382 A | 1/1996 | Fenzi et al. |
| 6,369,550 B1 | 4/2002 | Lou et al. |
| 7,782,059 B2 * | 8/2010 | DeVries et al. ............ 324/322 |
| 2003/0234684 A1 | 12/2003 | Oppelt |
| 2006/0033499 A1 * | 2/2006 | Flexman et al. ............ 324/322 |

FOREIGN PATENT DOCUMENTS

JP 05-048347 D3 2/1993

OTHER PUBLICATIONS

D.I. Hoult, Fast recovery, high sensitivity NMR probe and preamplifier for low frequencies, Review of Scientific Instruments, Feb. 1979, vol. 50, issue 2, pp. 193-200, abstract provided.

(Continued)

*Primary Examiner* — Louis M Arana
(74) *Attorney, Agent, or Firm* — Driggs, Hogg, Daugherty & Del Zoppo Co., LPA

(57) ABSTRACT

An apparatus for use in a magnetic resonance examination includes a radio frequency receive coil (50) and adjustable tuning circuitry (51) for adjusting the resonant frequency of the receive coil. The apparatus also includes a preamplifier (29) which amplifies signals generated by the receive coil. An adjustable feedback circuit (31) alters an effective Q of the receive coil.

20 Claims, 7 Drawing Sheets

OTHER PUBLICATIONS

Chang, et al., Stability and Noise Performance of Constant Transimpedance Amplifier with Inductive Source, IEEE Transactions on Circuits and Systems, Feb. 1989, pp. 264-271, vol. 36, No. 2.

California Eastern Laboratories, NEC GaAs HJ-FET L to S Band Low Noise Amplifier (New Plastic Package) NE38018, Oct. 11, 2000, 9 sheets.

R. Venook et al., Autouning Electronics for Varactor Tuned Flexible Interventional RF Coils, Proc. Intl. Soc. Mag. Reson. Med., vol. 10, p. 893, conference abstract.

Burr-Brown Products From Texas Instruments, Wideband, Low Distortion, Unity-Gain Stable, Voltage-Feedback Operational Amplifier OPA842, Nov. 2002—revised Dec. 2002, 23 sheets.

Albert Macovski, Novel Cryoelectronic Receiver Design for High Q Coils, NCRR Final Report Grant R21 HL60328, Mar. 12, 2003, pp. 1-16.

Burr-Brown Products From Texas Instruments, Wideband, Low Distortion, Medium Gain, Voltage-Feeback Operational Amplifier OPA843, Dec. 2002-Oct. 2003, 25 sheets.

International Search Report Re: PCT/US2005/042500, 4 sheets.

* cited by examiner

BANDWIDTH EXPANSION IN MAGNETIC RESONANCE

BACKGROUND

The present application claims priority to U.S. application Ser. No. 11/720,051 filed May 23, 2007, to issue as U.S. Pat. No. 7,782,059 on Aug. 24, 2010 which is the 35 U.S.C 371 filing of PCT/US2005/042500 filed on Nov. 22, 2005 which claims priority to U.S. Provisional Patent Application Ser. No. 60/630,223, entitled System and Method for Expanding Bandwidth of a Magnetic Resonance Imaging System U.S. Provisional Patent Application Ser. No. 60/630,220, entitled Apparatus and Method for Cryogenically Cooling a Coil on a Magnetic Resonance Imaging System, and U.S. Provisional Patent Application Ser. No. 60/630,547, entitled System and Method for Decoupling Coils in a Magnetic Resonance Imaging System, all of which were filed on Nov. 23, 2004.

The present invention relates to radio frequency (RF) coils and preamplifiers used in magnetic resonance (MR) applications. It finds particular application to MR imaging applications in which RF receive coils having relatively high quality factors (Qs) are used.

MR imaging has proven to be a valuable technique for providing information about the internal structure and function of an object under examination. In medical imaging, for example, MR imaging techniques are widely used to provide information on the physiology of human patients.

One limitation, however, on the utility of images and other information generated by MR scanners is the effect of noise. Indeed, signal to noise ratio (SNR) is a key parameter used to evaluate the quality of the information generated by an MR system.

Various techniques have been used to improve MR system SNR. One technique for improving SNR has been the use of low noise RF receive coils and preamplifiers. SNR is enhanced if the noise introduced by the receive coil and preamplifier is small in relation to the noise introduced by the object under examination (e.g., tissue noise in the case of a human patient).

Low noise receive coils have been implemented, for example incorporating high temperature superconductor (HTS) material or cold copper (i.e., conventional copper coils cooled to liquid nitrogen temperatures) to reduce the coil resistance. While these coils provide improved noise performance, they are characterized by coil Qs which are relatively higher than those of conventional coils. The higher Qs, however, lead to decreased coil bandwidth. Bandwidth is typically expressed as the ratio of coil resonant frequency divided by the coil Q. Thus, for example, a coil having a resonant frequency of 8.6 Megahertz (MHz) and a Q of 3300 would have a bandwidth of 2.6 kilohertz (KHz).

Moreover, higher Q coils are relatively more sensitive to the effects of coil loading, which can be subject to significant inter-patient or inter-object variability, and can also be affected by object motion. These effects tend to alter the phase response and impedance of the coil. Changes in capacitive loading, thermal effects, and the like can also cause shifts in coil resonant frequency. As coil bandwidth decreases, these shifts become relatively more significant.

Other trends, such as the development of faster pulse sequences, more powerful gradient systems, and MR guided interventional procedures in MR imaging have, on the other hand, placed increasing demands on coil and receive system bandwidth. In some cases, the bandwidth required by the MR system can greatly exceed the coil bandwidth. In any case, system performance can be enhanced by reducing the noise contribution of the coil while maintaining a reasonable coil bandwidth.

Various techniques have been used to expand coil bandwidth, for example as disclosed in U.S. Pat. No. 5,051,700 to Fox entitled Feedback Circuit for Noiseless Damping of the Q of an MRI Receiver Coil Antenna, U.S. Pat. No. 5,488,382 to Fenzi entitled Low Noise Preamplifier, and Chang, et al., *Stability and Noise Performance of Constant Transimpedance Amplifier with Inductive Source*, IEEE Transactions on Circuits and Systems, Vol. 36, No. 2, pp. 264-271 (February 1989).

Another technique has involved the use of double-tuned receive coils. However, double tuning has limited applicability. Broad bandwidth requires that the preamplifier noise remain low relative to the detector noise of a wide bandwidth, and that the power gain be high over this bandwidth. Single or multi-tuned coils maximize the low noise bandwidth by ensuring that the coil impedance alternates between two extremes: a high impedance limit that does not exceed the preamplifier current noise, and a low resistance limit that remains above the preamplifier voltage noise. Double coupling is one example of this technique, more generally called overcoupling. Unfortunately, however, overcoupling also results in relative large swings in signal amplitude over the effective bandwidth.

SUMMARY

Aspects of the present invention address these matters, and others.

According to a first aspect of the present invention, a method includes the steps of positioning an object to be imaged in relation to an MR imaging apparatus and an RF receive coil used in connection the MR imaging apparatus, adjusting a characteristic of a preamplifier which is electrically connected to the receive coil so as to reduce an effective Q of the receive coil, and using the MR imaging apparatus and the RF coil to conduct an MR imaging examination of the object. The steps of positioning, adjusting, and obtaining are repeated for a plurality of objects.

According to another aspect of the present invention, a magnetic resonance imaging apparatus includes a main magnet, a gradient coil, a transmit coil, a receive coil, and an amplifier which amplifies the electrical output signal produced by the receive coil. The apparatus also includes an input impedance adjustment circuit and a computer. The input impedance adjustment circuit is operatively connected to the amplifier and adapted to adjust the input impedance of the amplifier. The computer is operatively connected to the input impedance adjustment circuit so as to selectively adjust the input impedance of the amplifier.

According to another aspect of the present invention, a circuit for amplifying a radio frequency signal received by an RF coil of an MR system includes an amplifier and circuitry operatively connected to the amplifier. The circuitry is adapted to adjust an effective Q of the RF coil in response to a control signal generated by the MR system.

Those skilled in the art will appreciate still other aspects of the present invention upon reading an understanding the attached figures and description.

FIGURES

The present invention is illustrated by way of example and not limitation in the figures of the accompanying drawings, in which like references indicate similar elements and in which.

DESCRIPTION

Figure 1:
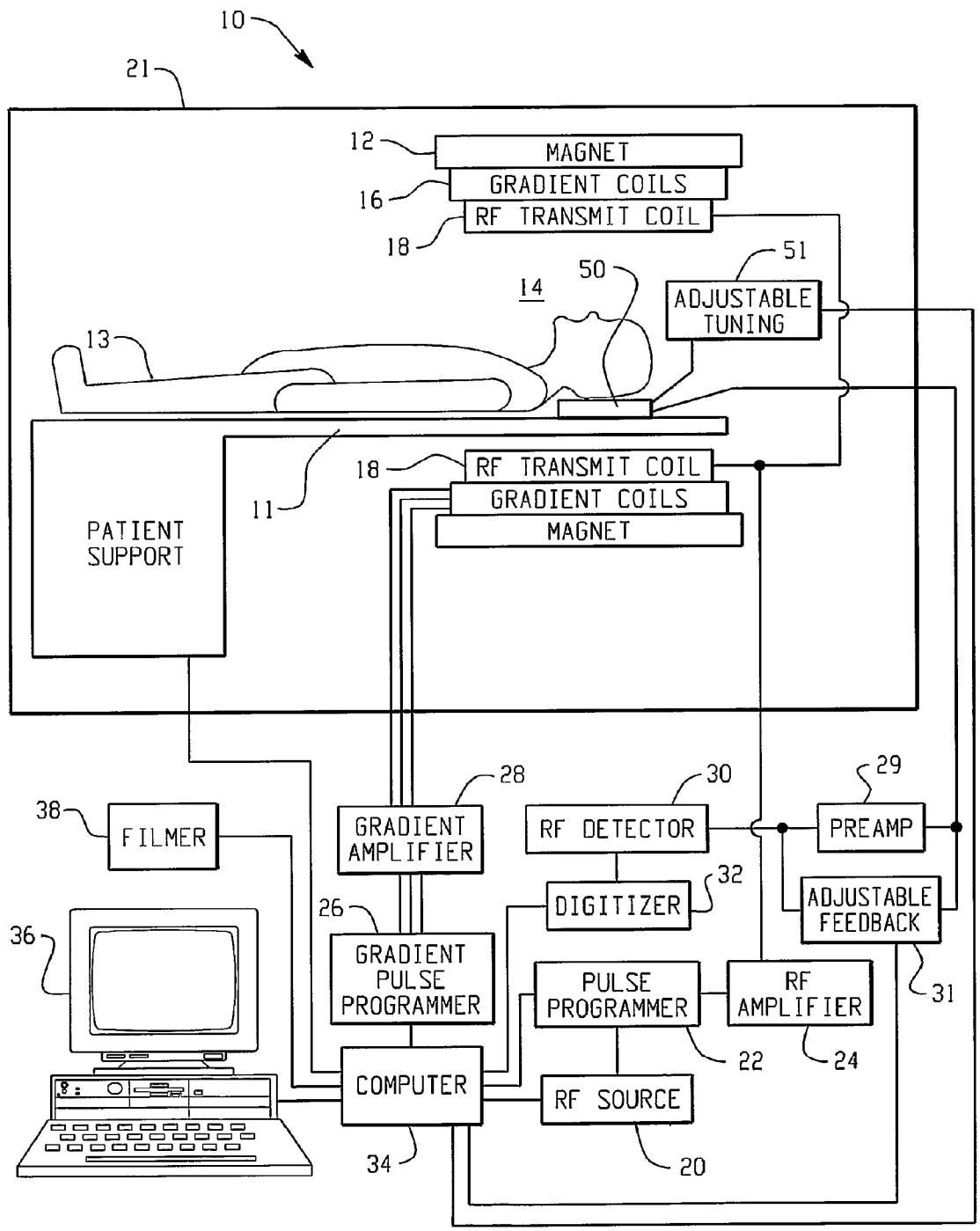
FIG. 1 depicts a functional block diagram of an MR system.

With reference to FIG. 1, an exemplary MR scanner 10 includes a main magnet 12 which produces a substantially homogeneous, temporally constant main magnetic field $B_0$ in an examination region 14. Depending on the desired main magnetic field strength and the requirements of a particular application, various magnet technologies (e.g., superconducting, resistive, or permanent magnet technologies) and physical magnet configurations (e.g., solenoidal or open magnet configurations) have been implemented.

A patient table 11 supports a human patient or other object being examined 13 in the examination region 14. Gradient coils 16 generate time varying gradient magnetic fields along the x, y, and z-axes of the examination region 14. An RF transmit coil 18 produces radio frequency signals which excite or otherwise manipulate hydrogen or other magnetic resonant active nuclei in the object 13. To improve the homogeneity of the excitation, a relatively large or whole body transmit coil is typically implemented.

An RF receive coil 50 located near a region of interest of the object 13 receives magnetic resonance signals generated by the excited nuclei. Associated with the receive coil 50 is variable tuning circuitry 51 which is used to adjust the resonant frequency or impedance characteristics of the receive coil 50.

While the transmit 18 and receive 50 coils are depicted as separate coils, a combined transmit receive coil may also be implemented, as may local transmit coils.

The magnet 12, patient support 11, gradient coils 16, and RF coils 18, 20 are typically located in a magnetically and radio frequency shielded enclosure 21.

An RF source 20 generates an RF signal having a desired frequency (e.g., the Larmor frequency of the MR active nuclei under investigation), a pulse programmer 22 shapes the RF signals, and an RF amplifier 24 amplifies the shaped signals to the levels required by the transmit coil 18 for exciting nuclei in the object 13. A gradient pulse programmer 26 establishes the shape and amplitude of the desired time varying magnetic fields, and a gradient amplifier 28 amplifies these signals to the levels required by the respective x, y, and z gradient coils 16.

A preamplifier 29 receives and amplifies the signals generated by the receive coil 50. Associated with the preamplifier 29 is adjustable feedback circuitry 31 which is used to modify the input impedance of the preamplifier 29. An RF detector 30 further receives and processes the signals generated by the preamplifier 29. The signals are in turn converted to digital form by a digitizer 32.

One or more computers 34 associated with the scanner 10 coordinate the operation of the gradient and RF systems, for example to generate desired pulse sequences and process the signals generated by the digitizer 32 to generate volumetric data indicative of the object. The computer(s) 34 also provide signals for controlling the operation of the adjustable tuning circuitry 51 and the adjustable feedback circuitry 31.

An operator console 36 includes human perceptible input and output devices such as a keyboard, mouse, and display or monitor. The console 36 allows the operator to interact with the scanner, for example by selecting desired pulse sequences and other desired examination protocols, initiating and terminating scans, and viewing and otherwise manipulating the volumetric data. A filmer or other hard copy device 38 may be used to provide images of the volumetric data.

Figure 2:
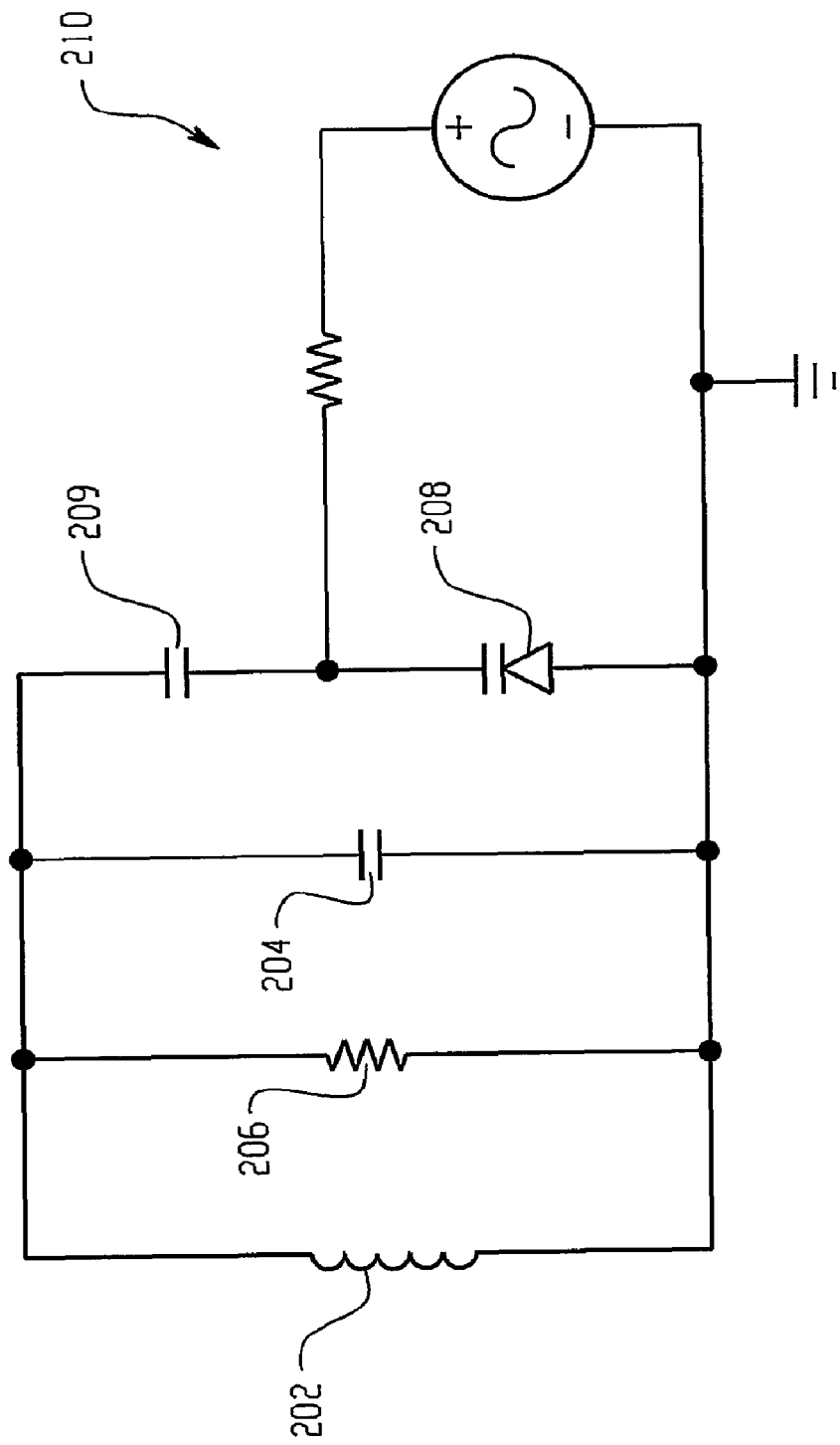
FIG. 2 depicts the equivalent electrical circuit of an RF coil.

FIG. 2 depicts an equivalent electrical circuit for the receive coil 50 and variable tuning circuitry 51. The receive coil 50 can be modeled as including a parallel connected inductor 202, capacitor 204, and resistor 206. As is conventional in the art, the coil 50 is designed so that the inductive and capacitive elements are resonant at the Larmor frequency of the MR active nuclei under investigation at the magnetic field strength generated by the main magnet 12. The coil conductor resistance and the electromagnetically coupled patient losses introduce a net series coil resistance. Series resistance associated with the coil 50 can be modeled as an equivalent parallel resistance 206. Decreasing the coil 50 series resistance increases the value of the parallel resistance 206 and raises the Q of the coil.

A varactor 208 is connected electrically in parallel with the capacitor 204 through blocking capacitor 209. Variable bias circuitry 210 operating under control of the MR system computer 34 applies a bias voltage to the varactor 208 so as to vary its capacitance. Varying the capacitance of the varactor 208 varies the resonant frequency of the coil 50.

As will be appreciated, the source impedance presented by the receive coil 50 varies as the signal frequency deviates from resonance. This variation increases as coil Q is increased. To provide improved SNR performance, it is desirable to use a preamplifier having an input stage which is relevantly tolerant of these impedance swings over a wide frequency range. So that the patient loaded coil noise dominates noise introduced by the preamplifier, the coil resistance noise power $4kTR_s$ preferably exceeds the voltage noise power $e_n^2$ and the current noise contribution $i_n^2|Z_s|^2$ of the preamplifier input stage. This in turn implies that the lower limit of the coil impedance is mainly determined by the preamplifier voltage noise, whereas the upper limit is mainly determined by the preamplifier current noise. Stated another way, preamplifier implementations which are characterized by both lower voltage and current noises are relatively more tolerant of impedance swings presented by the receive coil over a wider bandwidth.

While the above strategy is useful for expanding the useful SNR bandwidth, the system frequency response remains non-uniform. As will be appreciated, the amplitude of the signal generated by the receive coil 50 decreases as the signal frequency deviates from the resonant frequency of the coil. This falloff becomes steeper as coil Q is increased. To improve or equalize the frequency response, it is desirable to reduce the effective Q of the receive coil while minimizing the impact on noise performance. At the same time, it is also desirable to set the preamplifier input impedance at a value which is approximately equal to the geometric mean of the coil 50 impedance extremes within the expected signal bandwidth.

Stated another way, the general goal is to provide a wideband amplifier and supply feedback to the input either in parallel or in series to equalize the frequency response over the anticipated bandwidth while maintaining relatively low noise and high gain. Advantageously, the feedback may be dynamically adjustable to allow for variable tuning and coil load conditions and interactions.

Figure 3:
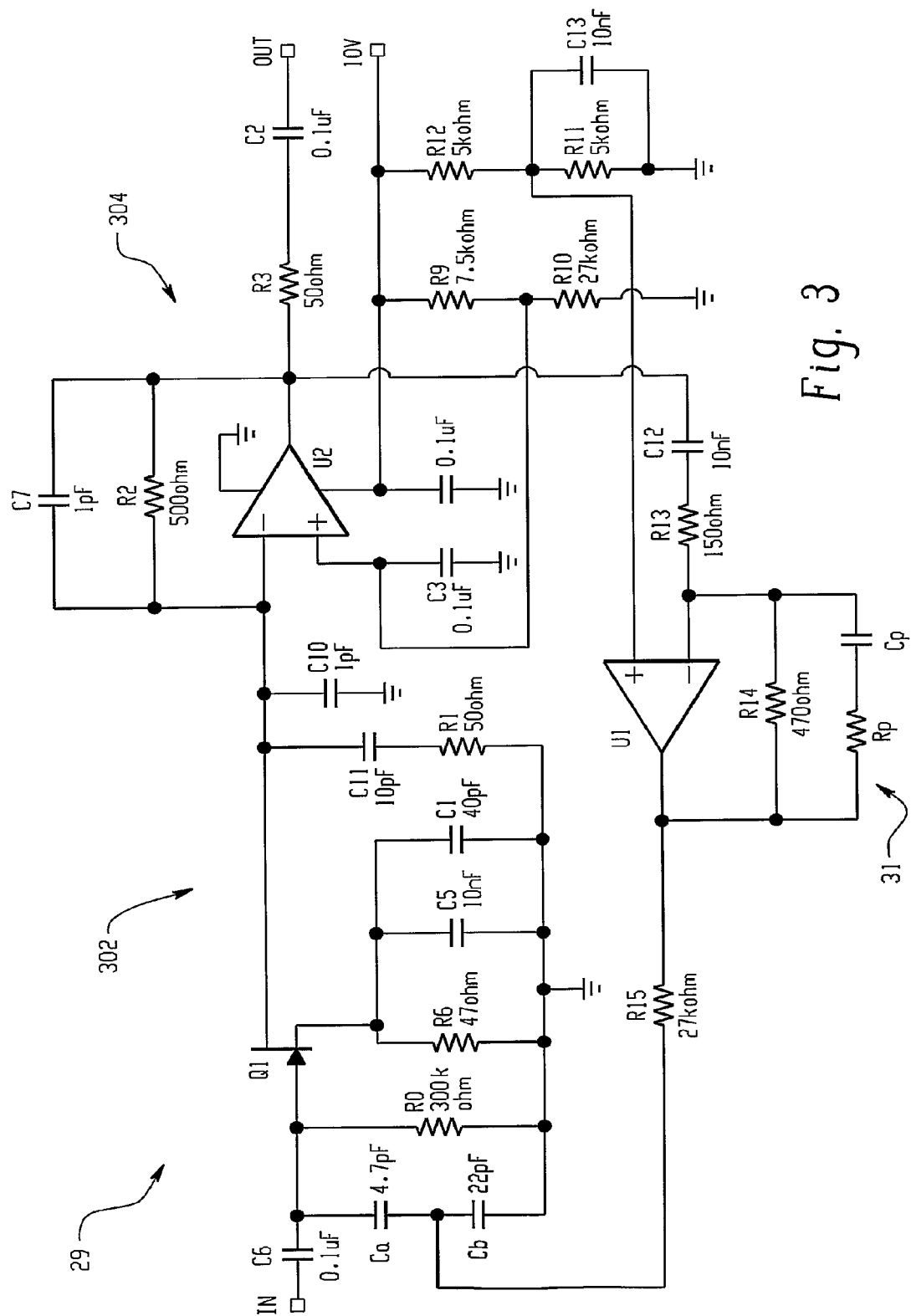
FIG. 3 is a schematic diagram of a preamplifier and adjustable feedback circuitry.

FIG. 3 depicts a schematic diagram of an exemplary preamplifier 29 and adjustable feedback circuitry 31 designed for operation at approximately 8.6 Megahertz (MHz), the Larmor frequency of hydrogen nuclei at a field strength of 0.2 Tesla (T). As shown in FIG. 3, the preamplifier 29 includes first 302 and second 304 amplifier stages which function as a cascode amplifier, albeit with a non-inverting output. The feedback circuitry 31 provides parallel or shunt feedback to the first amplifier stage 302.

The first stage 302 acts as a transconductance amplifier and preferably has low voltage and current noise. The first stage 302 includes a field effect transistor (FET) Q1 in a common source configuration. In the illustrated implementation, Q1 is an NE38018 gallium arsenide high electron mobility transistor field effect transistor (GaAs HEMT FET) manufactured by Nippon Electric Corporation (NEC) of Tokyo, Japan, although other devices may be utilized.

A resistor R0 is connected between the gate of the transistor Q1 and ground. By selecting a relatively high value for resistor R0, little current noise is added to the first stage 302. Biasing of transistor Q1 is provided by resistor R6 in parallel with capacitors C1 and C5. R6 is selected to provide a stable bias point and current flow between the drain and source of the transistor Q1. R6 also sets the gain of the first amplifier stage 302. Capacitors C10, C11 and R1 provide high frequency termination for the transistor Q1, where the high frequencies are in the Gigahertz (GHz) range. By terminating high frequencies in the first stage 202, the second stage 204 does not amplify these frequencies.

The configuration of the transistor Q1 enables the transistor Q1 to be self-biased in that the gate is virtually at zero volts. The transistor Q1 is biased on when current causes a DC voltage across resistance R6, which causes the source of the transistor Q1 to be at a low voltage (e.g., 0.25V-0.5 V). This configuration also causes the source to be reverse biased with respect to the gate.

The second stage 304 is configured as an inverting transimpedance amplifier using a wideband operational amplifier U2. In the illustrated implementation, U2 is an OPA843 operational amplifier available from Texas Instruments Corporation of Dallas, Tex., although other devices may be utilized.

The non-inverting input of the op amp U2 is biased to approximately 2.6 volts direct current (VDC) via a voltage divider formed by resistors R9 and R10. As will be appreciated by those skilled in the art, the inverting input of the op amp U2 and hence the drain of the transistor Q1 are maintained at the same DC bias voltage as the non-inverting input.

The gain of the second stage 304 is established by resistor R2. Bypass capacitor C7 reduces gain and improves stability at higher frequencies. The output of the preamplifier 29 is further processed by RF detector 30. As depicted, the preamplifier 29 provides an open loop gain of about 50V/V at 8.6 MHz.

The feedback circuitry 31 includes an active gain element such as a wideband operational amplifier U2. In the illustrated implementation, U2 is an OPA842 operational amplifier available from Texas Instruments Corporation of Dallas, Tex., although other devices may be utilized. The amplifier is configured as an inverting transimpedance amplifier.

As will be appreciated by those skilled in the art, the gain and phase shift of the amplifier is established by resistors R13, R14, and Rp, and capacitors Cp and C12. C12 is also useful for inhibiting low frequency feedback and reducing instabilities resulting from interactions with the first stage amplifier 302 source bypass capacitance.

In one embodiment, the values of resistor Rp and Cp are adjustable. Adjustability may be provided by way of suitable digital potentiometers, varactor circuits, or the like operating under the control of the computer(s) 34 associated with the MR system 10.

The signal response may advantageously be flattened to desensitize the coil and preamplifier to phase errors resulting from changes in coil tuning and loading, thus increasing the usable bandwidth. Depending on the requirements of a particular application, these values may be also manipulated so that the input of the first stage 302 has a resistive, capacitive, or even inductive input impedance. As will also be appreciated, altering the input impedance alters the available power gain of the amplifier, the available power gain being substantially maximized when the source and input impedance are matched.

Fixed values of resistance and/or capacitance value may also be implemented.

The output of the op amp U1 is fed back to the first stage amplifier 202 by way of a tapped-capacitor resistor network formed by capacitors C14, C15 and feedback resistor R15. Connecting the feedback resistor R15 between the tapped capacitors C14 and C15 allows a lower value of the feedback resistor R15 to be used. This in turn provides more predictable RF performance without a substantial increase in current noise.

While the above has focused on a parallel feedback at the amplifier input, series feedback can also be implemented. Thus, for example, the feedback may be introduced via a tapped-inductor resistor network in the source arm of the transistor Q1. Where the system includes an array of receive coils, such an arrangement is especially well suited to synthesizing low resistance and inductance inputs that can make a coil appear detuned or open circuited to an adjacent coupled coil. In this manner, coil arrays can be decoupled using feedback rather than via traditional methods in which the input matching circuit makes a coil appear to be open-circuited.

Figure 4A:
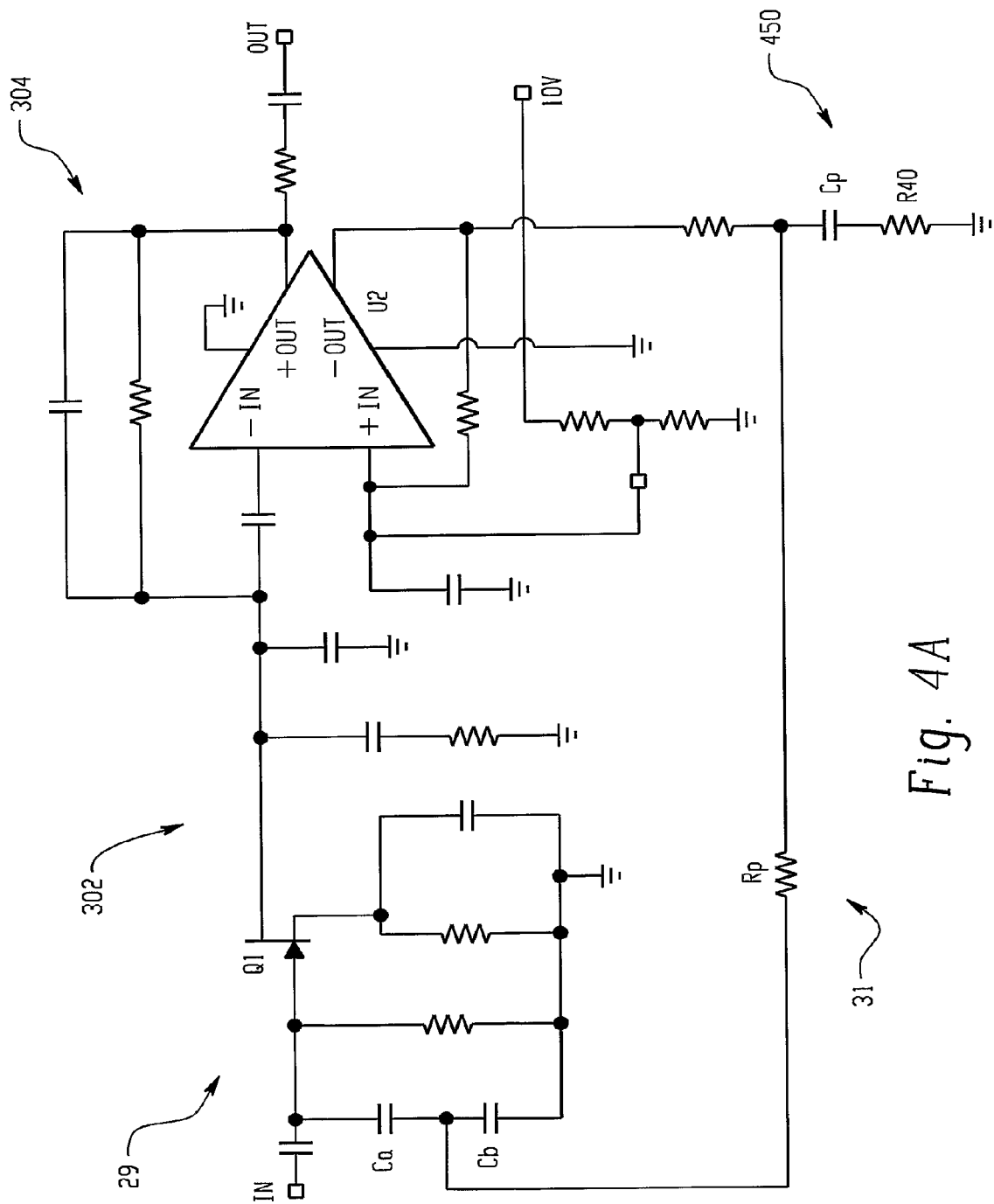
FIG. 4a is a schematic diagram of a preamplifier and feedback circuitry.
Figure 4B:
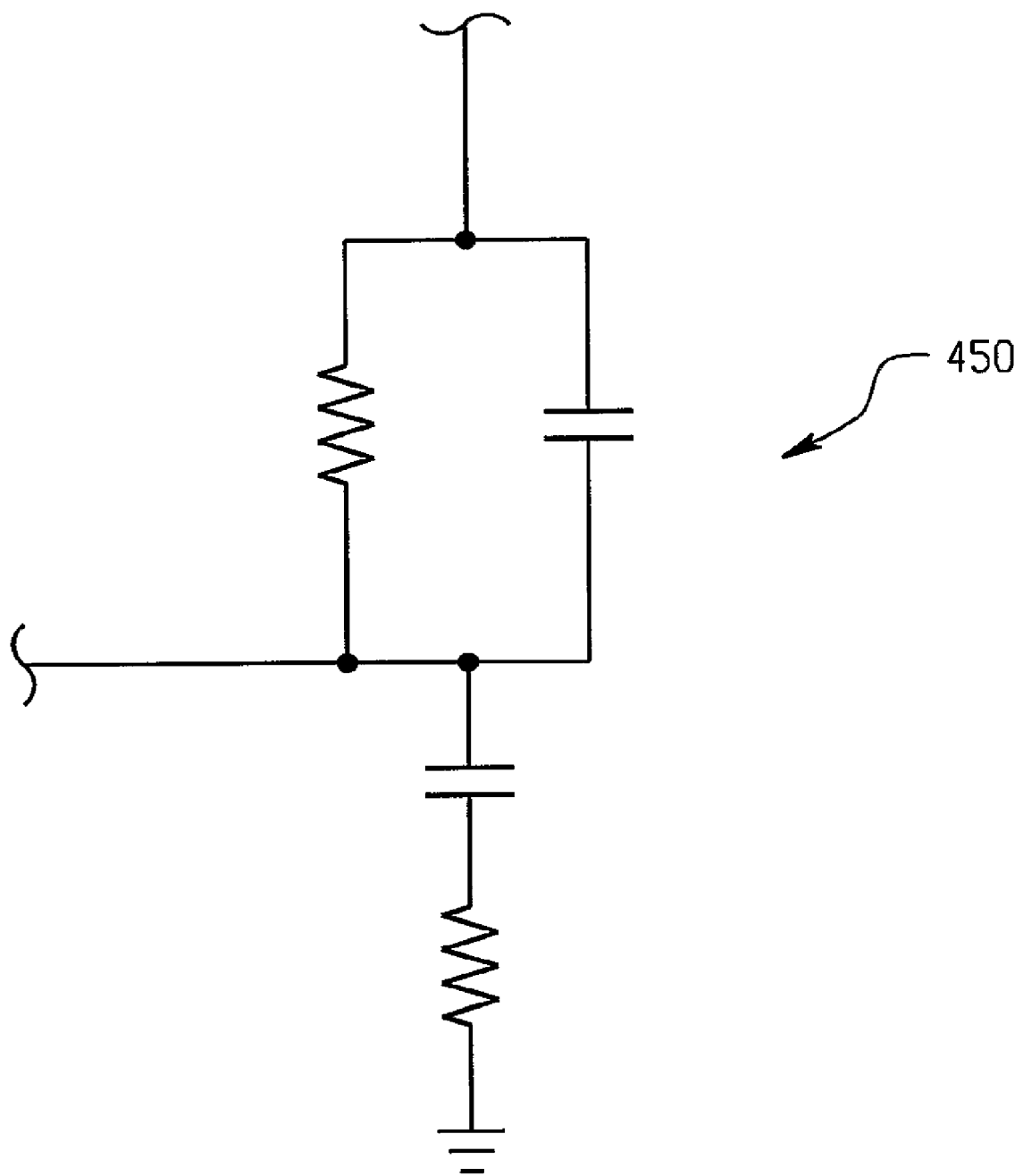
FIG. 4b is a schematic diagram of a lead-lag network.

An implementation of the preamp 29 and adjustable feedback circuitry 31 which incorporates a differential amplifier having both inverting and non-inverting outputs is depicted in FIG. 4a. In such a configuration, the inverting output can be used to drive the feedback circuitry 31 directly, and the op amp U1 of FIG. 3 can be omitted. As shown in FIG. 4a, the feedback circuitry 31 incorporates a lead-lag network including resistor R40 and capacitor Cp. The lead lag network is connected to the inverting output of U2 and the network is used to alter the phase characteristics of the feedback. Another more general lead-lag network 450 is shown in FIG. 4b. Adjustable gain and/or reactance may also be placed in one or both of the feedback branches of the differential op-amp. An op amp stage having adjustable gain and/or phase characteristics analogous to that of U1 may also be included in the feedback loop, albeit configured as a non-inverting amplifier.

Figure 5:
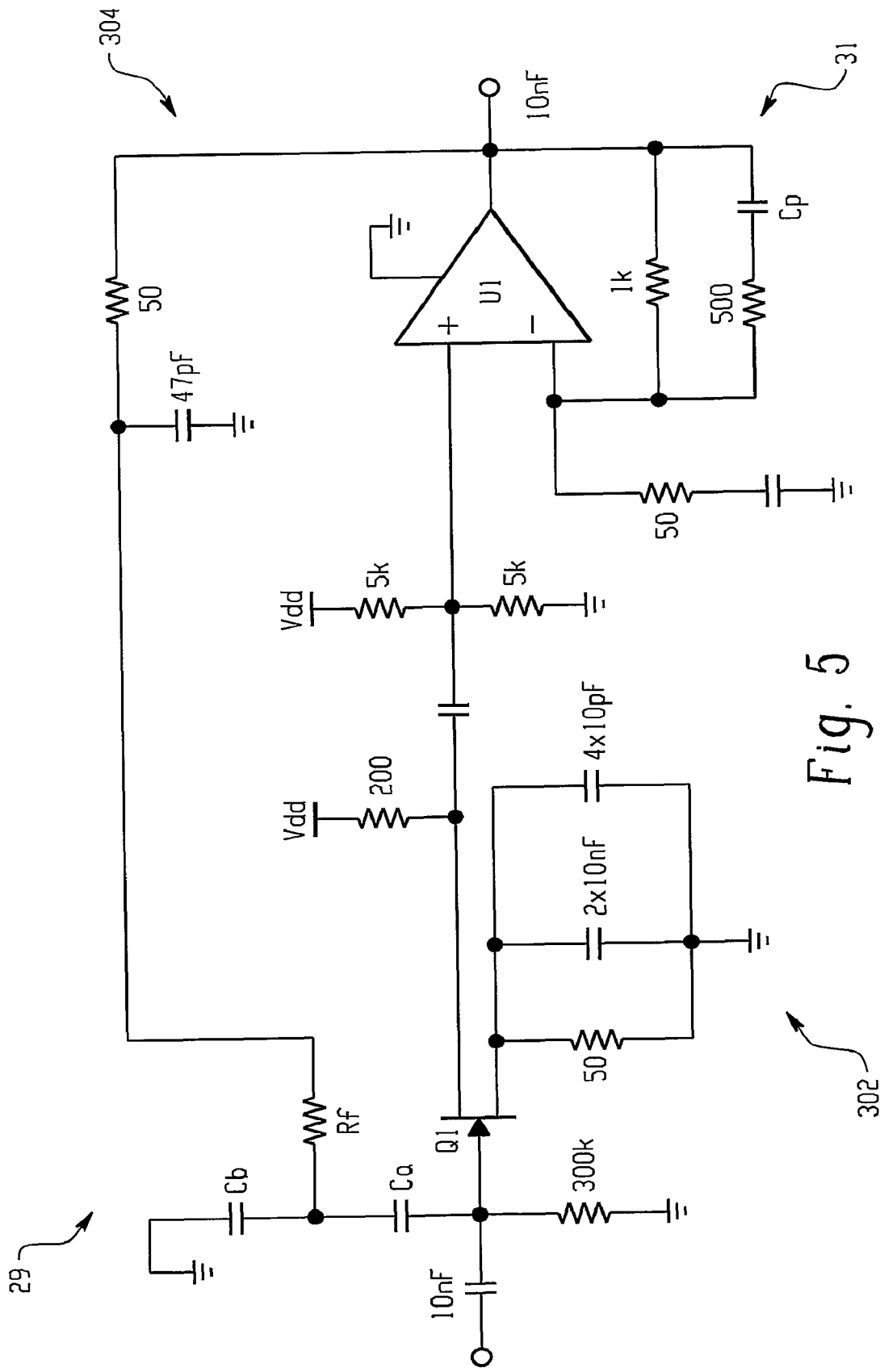
FIG. 5 is a schematic diagram of a preamplifier and feedback circuitry.

FIG. 5 depicts another implementation of the preamplifier 29 and adjustable feedback circuitry 31. As illustrated, the first stage 302 is configured as an inverting voltage amplifier, while the second stage 304 is configured as a non-inverting voltage amplifier. The variable capacitance Cp is used to vary the phase response of the second amplifier stage 304, which is in turn used to drive the split-capacitor resistor arrangement formed by capacitors Ca and Cb and resistor Rf. While depicted as having a fixed value, resistor R500 may also be adjustable so as to vary the second stage 304 gain.

While the above discussion has focused primarily in relation to hydrogen nuclei at 0.2 T, those skilled in the art will recognize that the described techniques can be extended to other nuclei and at higher field strengths through the use of components and design principles appropriate to the relevant frequency or frequencies.

Figure 6:
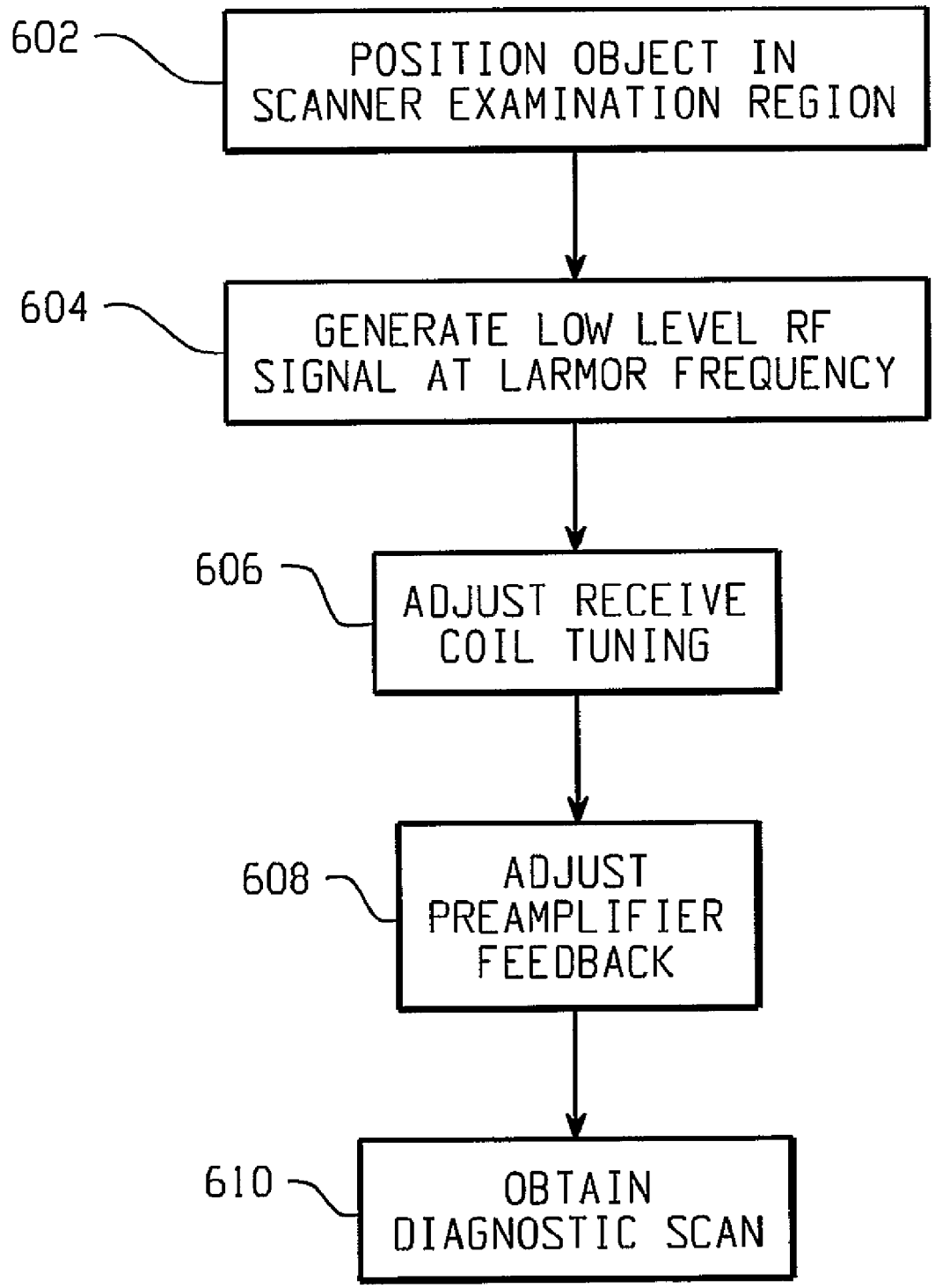
FIG. 6 depicts a sequence of steps for obtaining a MR examination.

In operation, and with reference to FIG. 6, a patient or other object to be examined 13 is positioned in the examination region 14 for a scan; the RF coil 50 is likewise positioned in relation to the object.

At 604, the scanner's RF transmit system is used to generate a constant amplitude, low level RF signal at the Larmor frequency of the nuclei being examined (e.g., approximately 8.6 MHz for hydrogen nuclei at 0.2 T).

The receive coil 50 tuning is adjusted at 606. More particularly, the feedback circuitry 21 is disabled so that the preamplifier 29 operates as an open loop amplifier. The adjustable tuning circuitry 51 is used to vary the resonant frequency of the receive coil 50 over a range of frequencies, and the amplitude of the signal generated by the receive coil 50 and preamplifier 29 is measured. More specifically, this information may be obtained by evaluating the amplitude of signal produced by the digitizer 32. The coil is tuned to the Larmor frequency where the signal amplitude is at its maximum. The feedback circuitry is then re-enabled.

The preamplifier 29 feedback is adjusted at 608 to provide a desired frequency response. More specifically, the values of resistance Rp and/or capacitance Cp are established at a first value. The RF signal is generated at a plurality of frequencies in the range of frequencies expected to be received during the scan of the object, and the signal amplitude is measured at each. This process is repeated for a plurality of resistance and or capacitance values. In an embodiment particularly well suited for improving SNR performance, the values of Rp and/or Cp which provide the least variation in signal amplitude across the frequency range are selected.

A diagnostic scan of the object 13 is obtained at 610. The tuning procedures may be repeated as desired, for example between patients, when motion of the object is suspected to have altered the loading or resonant frequency of the coil, when the coil resonant frequency is otherwise suspected of having drifted, or the like.

In addition, the narrower bandwidth of a high Q coil places more stringent demands on the precision with which the coil is tuned. In some configurations the swing in frequency of the coil as it is loaded due to differing sizes of the sample can be larger than the bandwidth of the coil. For example, a coil having a resonant frequency of 8.6 MHz and a Q of 430 would have a bandwidth of 20 kHz. However the frequency of the coil as it is loaded with varying samples, for example a child or a large man, can shift the frequency of the coil by more than 20 kHz causing the coil to shift off the resonance frequency. The bandwidth expansion circuitry can be used to reduce the impact of receive coil frequency shifts due to variations in patient or sample loading.

As discussed above, these effects may be addressed by adjusting the tuning of the coil. Alternatively, the preamplifier 29 feedback and corresponding bandwidth expansion may be employed to reduce effects of the coil frequency shift between samples without using an explicit coil tuning or preamplifier adjustment step as part of the patient examination process.

More specifically, the bandwidth provided by a particular coil, the effects of variations in coil loading, and the bandwidth required by a particular protocol or protocols may be evaluated a priori. The preamplifier 29 feedback is then fixed at a value which improves the uniformity of the system frequency response for the desired protocols. Such an arrangement is particularly advantageous where the bandwidth provided by the coil 50 and the bandwidth required by the protocol or protocols are similar.

Where a desired protocol requires additional bandwidth, or where a particular sample presents a coil loading beyond the desired limits, an alternate coil is used. Desired combinations of protocols, coils, and patient loading information may be stored in a memory associated with the MR scanner 10. In such an arrangement, the MR system 10 may be programmed to confirm to the user that a particular coil is suitable, or indicate that an alternate coil or protocol should be used.

Of course, modifications and alterations will occur to others upon reading and understanding the preceding description. It is intended that the invention be construed as including all such modifications and alterations insofar as they come within the scope of the appended claims or the equivalents thereof.

What is claimed is:

1. An apparatus comprising:
   a receive coil which receives RF signals and produces an electrical output signal in response thereto;
   a preamplifier which amplifies the electrical output signal, wherein the preamplifier has an input impedance; and
   adjustable feedback circuitry, including:
      a variable resistance; and
      a variable reactance,
      wherein the adjustable feedback circuitry is operatively connected to the preamplifier and automatically adjusts the input impedance of the preamplifier so as to alter an effective Q of the receive coil.

2. The apparatus of claim 1, further comprising:
   a computer operatively connected to the adjustable feedback circuitry so as to selectively adjust the input impedance of the preamplifier.

3. The apparatus of claim 2, wherein in the receive coil has a resonant frequency, and further including a tuning circuit operatively connected to the receive coil and adapted to adjust the resonant frequency.

4. The apparatus of claim 3, wherein the computer is operatively connected to the tuning circuit so as to selectively adjust the resonant frequency.

5. The apparatus of claim 1, wherein the receive coil impedance varies as a function of the frequency of the RF signals.

6. The apparatus of claim 2, wherein the RF signals have an expected signal bandwidth, and the computer adjusts the input impedance to a value that is approximately equal to a mean of the coil impedance extremes over the expected signal bandwidth.

7. The RF apparatus of claim 1, wherein the feedback circuitry provides a shunt feedback.

8. The apparatus of claim 1, wherein the feedback circuitry provides a series feedback.

9. The apparatus of claim 1, wherein the preamplifier includes first and second amplifier stages.

10. The apparatus of claim 9, wherein the second stage is configured as a non-inverting amplifier.

11. The apparatus of claim 10, wherein the variable resistance and the variable reactance vary a gain and a phase response of the second amplifier stage.

12. The apparatus of claim 9, wherein the first and second amplifier stages are arranged in a cascade configuration.

13. A method comprising:
   adjusting feedback circuitry of a preamplifier which is electrically connected to an RF receive coil, the feedback circuitry including a variable resistance and a variable reactance, and wherein adjusting includes adjusting at least one of the variable resistance and the variable reactance so as to adjust the effective Q of the receive coil.

14. The method of claim 13, wherein adjusting includes adjusting both the variable resistance and the variable reactance.

15. The method claim 13, wherein the preamplifier includes a transconductance amplifier.

16. The method of claim 13, wherein the feedback is provided through one of a tapped inductor or a tapped capacitor.

17. The method of claim 13, wherein adjusting the feedback circuitry includes adjusting a gain of an amplifier disposed in a feedback loop.

18. The method of claim 13, wherein adjusting the feedback circuitry includes adjusting a phase response of an amplifier disposed in a feedback loop.

19. The method of claim 1, wherein adjusting includes using a computer to adjust at least one of the variable resistance and the variable reactance.

20. An apparatus comprising:
a computer; and
an RF receive portion having feedback circuitry, including a variable resistance and a variable reactance, wherein the computer automatically adjusts at least one of the variable resistance and the variable reactance to adjust an effective Q of the apparatus.

* * * * *